(12) United States Patent
Fujiwara et al.

(10) Patent No.: US 11,069,550 B2
(45) Date of Patent: Jul. 20, 2021

(54) LOAD PORT

(71) Applicant: HIRATA CORPORATION, Kumamoto (JP)

(72) Inventors: Itsuo Fujiwara, Kumamoto (JP); Yoichi Matsushita, Kumamoto (JP)

(73) Assignee: HIRATA CORPORATION, Kumamoto (JP)

( * ) Notice: Subject to any disclaimer, the term of this patent is extended or adjusted under 35 U.S.C. 154(b) by 0 days.

(21) Appl. No.: 16/827,801

(22) Filed: Mar. 24, 2020

(65) Prior Publication Data
US 2020/0312690 A1    Oct. 1, 2020

(30) Foreign Application Priority Data
Mar. 28, 2019    (JP) .............................. JP2019-063990

(51) Int. Cl.
*H01L 21/67* (2006.01)
*H01L 21/677* (2006.01)

(52) U.S. Cl.
CPC .. *H01L 21/67742* (2013.01); *H01L 21/67745* (2013.01)

(58) Field of Classification Search
None
See application file for complete search history.

(56) References Cited

U.S. PATENT DOCUMENTS

| 6,281,516 | B1* | 8/2001 | Bacchi ............. | H01L 21/67373 206/408 |
| 7,021,882 | B2* | 4/2006 | Otaguro ............ | H01L 21/67772 414/217.1 |
| 8,821,099 | B2 | 9/2014 | Hall et al. | |
| 2002/0069933 | A1* | 6/2002 | Otaguro ............ | H01L 21/67772 141/98 |
| 2006/0245849 | A1* | 11/2006 | Yokoyama ........ | H01L 21/67772 414/217 |
| 2007/0066204 | A1* | 3/2007 | Tanimura ......... | H01L 21/67775 454/65 |

(Continued)

FOREIGN PATENT DOCUMENTS

| JP | 4526535 B2 | 8/2010 |
| JP | 6038476 B2 | 12/2016 |

(Continued)

OTHER PUBLICATIONS

Office Action dated Nov. 10, 2020, by the Taiwanese Patent Office in corresponding Taiwanese Patent Application No. 109107212. (6 pages).

*Primary Examiner* — Ronald P Jarrett
(74) *Attorney, Agent, or Firm* — Buchanan Ingersoll & Rooney PC

(57) ABSTRACT

A load port includes: a port plate; and a placing table on which a container that stores the substrate is placed. The placing table includes: a base portion; a dock plate; a support unit configured to support the dock plate such that the dock plate can move between the first position and a second position; and a cam mechanism configured to move the dock plate between the first position and the second position. The support unit includes a slider configured to move together with the dock plate. The cam mechanism includes: a driving mechanism provided on the base portion; and a cam plate which is connected to the slider and in which a cam groove is formed.

13 Claims, 13 Drawing Sheets

(56) References Cited

U.S. PATENT DOCUMENTS

2008/0019804 A1    1/2008  Toyoda
2011/0188977 A1*  8/2011  Toyoda .................. H01L 21/67
                                                          414/411
2014/0369793 A1  12/2014  Hall et al.

FOREIGN PATENT DOCUMENTS

| JP | 2018006705 A | 1/2018 |
| TW | 200733289 A | 9/2007 |
| TW | 201351549 A | 12/2013 |
| TW | 201804556 A | 2/2018 |
| WO | 2005/122241 A1 | 12/2005 |

* cited by examiner

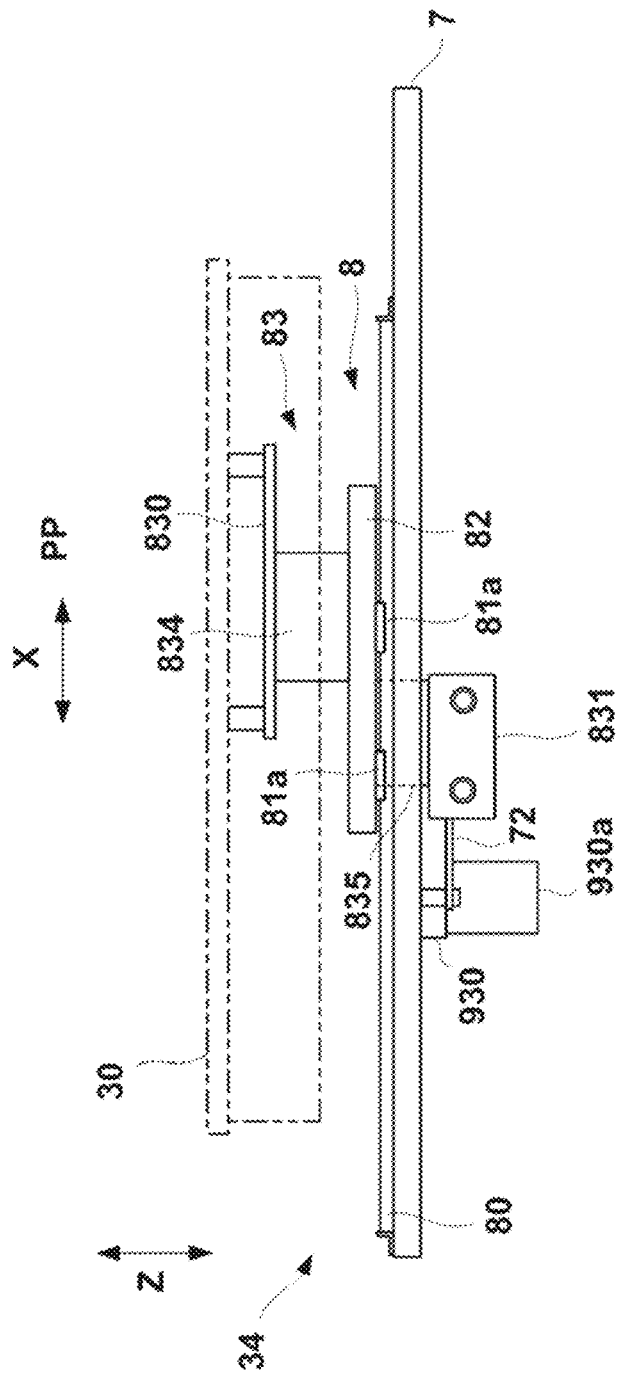

LOAD PORT

CROSS-REFERENCE TO RELATED APPLICATION(S)

This application claims priority to and the benefit of Japanese Patent Application No. 2019-063990 filed on Mar. 28, 2019, the entire disclosure of which is incorporated herein by reference.

BACKGROUND OF THE INVENTION

Field of the Invention

The present invention relates to a load port.

Description of the Related Art

A container such as a FOUP, which stores a substrate such as a semiconductor wafer, is known. Such a container is opened/closed in a load port provided in a substrate conveying apparatus to take in or out the substrate in the container. The load port is provided with a dock plate on which the container is placed, and a mechanism configured to move the dock plate. The dock plate is moved between a position to transfer the container and a position to open/close the container (Japanese Patent Laid-Open No. 2018-6705 and Japanese Patent No. 6038476). Japanese Patent Laid-Open No. 2018-6705 discloses a mechanism using a cylinder.

In a mechanism using a cylinder, as in Japanese Patent Laid-Open No. 2018-6705, a long cylinder is needed in proportion to the moving distance of the dock plate, and the moving mechanism tends to be bulky. There is demand for a size reduction in the moving mechanism.

SUMMARY OF THE INVENTION

It is an object of the present invention to provide a load port that can move a dock plate by a relatively compact mechanism and can be installed and used without depending on the installation environment or operation state of a container storage (stocker), an overhead hoist transport (OHT) system, or the like.

According to an aspect of the present invention, there is provided a load port comprising: a port plate including an opening portion capable of taking in and out a substrate; and a placing table on which a container that stores the substrate is placed, wherein the placing table comprises: a base portion; a dock plate on which the container is placed; a support unit provided between the base portion and the dock plate and configured to support the dock plate such that the dock plate can move between the first position on a side of the port plate and a second position apart from the port plate; and a cam mechanism configured to move the dock plate between the first position and the second position with respect to the base portion, the support unit includes a slider on which the dock plate is placed and which is configured to move together with the dock plate, the cam mechanism includes: a driving mechanism provided on the base portion; and a cam plate which is connected to the slider and in which a cam groove is formed, the driving mechanism includes: a rotation driving unit; a rotation shaft rotated by the rotation driving unit; a long piece-shaped rotation member fixed to the rotation shaft and configured to rotate about the rotation shaft as a rotation center; and a first cam follower and a second cam follower, which are provided in the rotation member, and the cam groove includes: a first cam groove engaging with the first cam follower; and a second cam groove formed at a position different from the first cam groove in a moving direction of the dock plate and engaging with the second cam follower.

Further features of the present invention will become apparent from the following description of exemplary embodiments (with reference to the attached drawings).

BRIEF DESCRIPTION OF THE DRAWINGS

FIG. 7 is an explanatory view of the moving mechanism of the dock plate;

DESCRIPTION OF THE EMBODIMENTS

Figure 1:
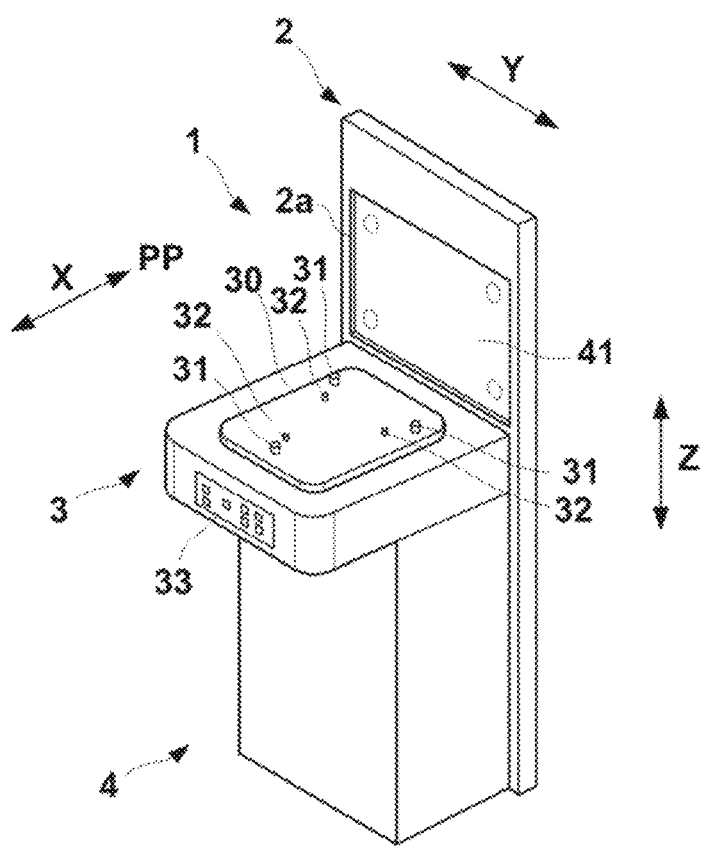
FIG. 1 is a view showing the outer appearance of a load port according to an embodiment of the present invention.

Hereinafter, embodiments will be described in detail with reference to the attached drawings. Note that the following embodiments are not intended to limit the scope of the claimed invention, and limitation is not made an invention that requires all combinations of features described in the embodiments. Two or more of the multiple features described in the embodiments may be combined as appropriate. Furthermore, the same reference numerals are given to the same or similar configurations, and redundant description thereof is omitted.

First Embodiment

<Outline of Apparatus>

Figure 2:
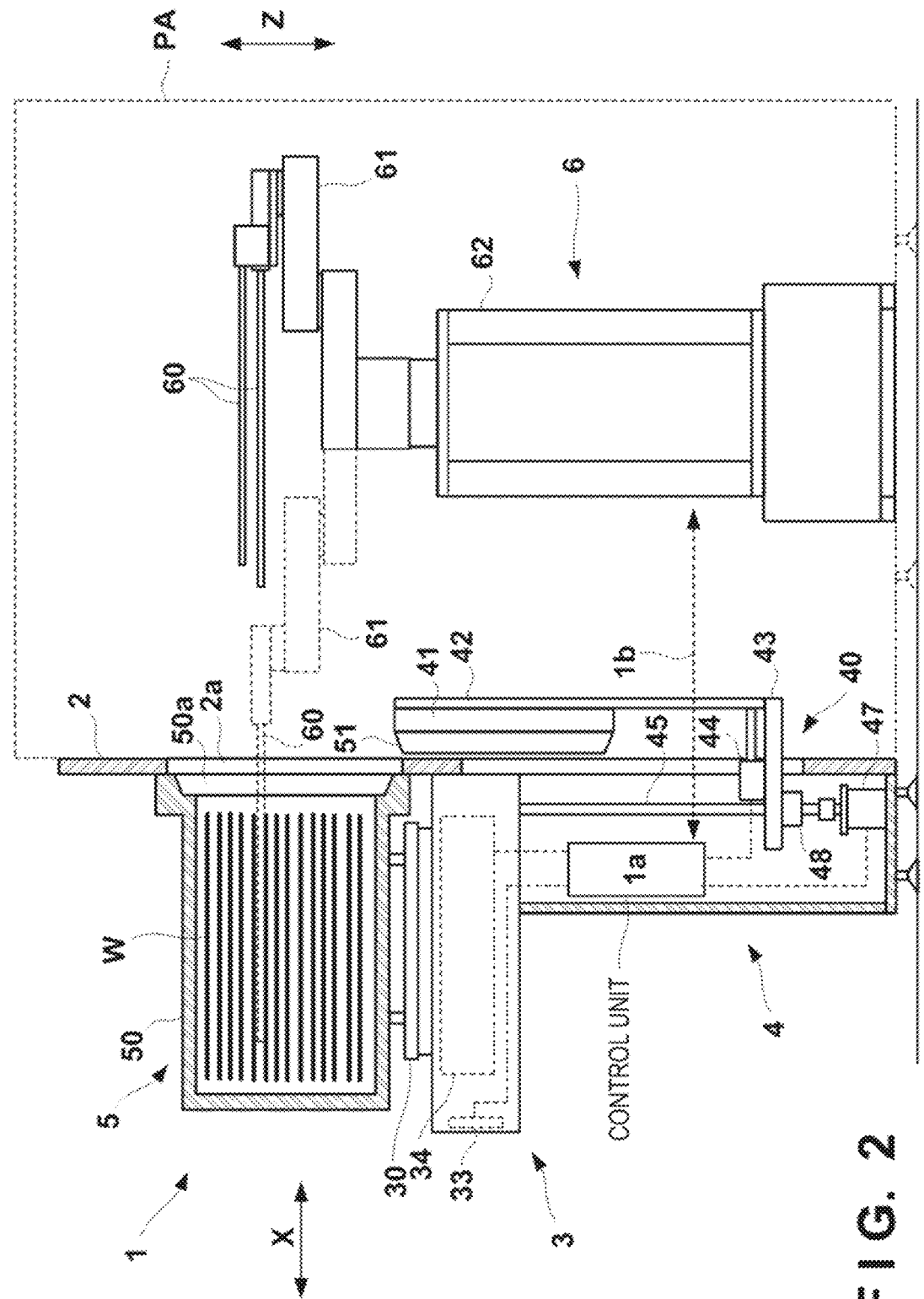
FIG. 2 is a view showing the internal mechanism and a use example of the load port shown in FIG. 1.

FIG. 1 is a view showing the outer appearance of a load port 1 according to an embodiment of the present invention. FIG. 2 is a view showing the internal mechanism and a use example of the load port 1. In the drawings, arrows X and Y indicate horizontal directions orthogonal to each other, and an arrow Z indicates a vertical direction. In addition, of the X directions, PP represents the side of a port plate 2. The meanings of these arrows also apply to other drawings as well.

The load port 1 is an apparatus that opens/closes a container 5 such as a FOUP. The container 5 includes a box-shaped container main body 50 having, in a side portion, an opening portion 50a used to take in or out a substrate W such as a semiconductor wafer, and a lid (door) 51 that is detachably attached to the opening portion 50a and closes the opening portion 50a. Note that FIG. 2 shows a state (open state) in which the lid 51 is removed by the load port 1, and a substrate conveying robot 6 can access the substrate W in the container 5.

The load port 1 includes the port plate 2, a placing table 3 on which the container 5 is placed, and a support portion 4 that supports the placing table 3. The port plate 2 is a plate-shaped body extending in the Z direction. The port plate 2 includes an opening portion 2a through which the removed lid 51 can pass in the X direction. At least one load port 1 is attached to a substrate conveying apparatus PA incorporating the substrate conveying robot 6 that conveys the substrate W. The substrate conveying robot 6 performs unloading and loading of the substrate W from and into the container 5 on the load port 1. The substrate conveying robot 6 includes an end effector 60 that holds the substrate W, an articulated arm 61 that holds the end effector 60 such that it can at least freely move forward and backward, and a driving unit 62 that makes the articulated arm 61 move forward/backward, turn, and move upward/downward. In the above-described open state, when the substrate conveying robot 6 is made to enter the container main body 50 communicating with the substrate conveying apparatus PA, unloading and loading of the substrate W are performed.

The placing table 3 includes a dock plate 30 on which the container 5 is placed. The dock plate 30 is provided with a plurality of positioning pins 31 that support the container 5 while positioning it, and a plurality of detection pins (presence sensors) 32 configured to detect the presence of the container 5. The placing table 3 incorporates a driving mechanism 34 that displaces the dock plate 30 in the X direction. In addition, the placing table 3 includes an operation panel 33 on the front surface. An operator can do settings of the load port 1 and operation instructions via the operation panel 33.

The support portion 4 is a hollow body having a rectangular parallelepiped shape. The support portion 4 includes a mechanism 40 configured to move a port door 41 that holds the lid 51 between a close position where the lid 51 closes the opening portion 50a, a retreat position where the lid 51 retreats through the opening portion 2a, and an open position (the position in the open state shown in FIG. 2) where the lid 51 retreats to the lower side of the lower edge of the opening portion 2a. The port door 41 includes, for example, a chucking mechanism, and the port door 41 can thus chuck and hold the lid 51. In addition, the port door 41 is provided with an operation mechanism (latch key) that operates a mechanism included in the lid 51. This can detach and attach the lid 51 from and to the container main body 50.

The port door 41 is supported by a connecting member 42 extending in the Z direction. The connecting member 42 is supported by a stage member 43 to be slidable in the X direction, and is moved in the X direction by an actuator 44 such as a ball screw or an electric cylinder. In addition, a ball nut 48 engaging with a ball screw shaft 45 extending in the vertical direction is fixed to the stage member 43. When the ball screw shaft 45 is rotated by a motor 47, the port door 41, the connecting member 42, and the stage member 43 integrally move upward or downward.

With the above-described structure, the port door 41 can be moved in the X direction and the Z direction. Hence, the lid 51 is moved between the close position, the retreat position, and the open position. Note that the mechanism that moves the port door 41 is not limited to this, and various mechanisms can be employed.

The load port 1 is provided with a control unit 1a. The control unit 1a includes, for example, a processing unit represented by a CPU, storage units such as a RAM and a ROM, an input/output interface between an external device and the processing unit, and a communication interface that performs communication with a computer such as a host computer or a peripheral device (the substrate conveying apparatus PA, the substrate conveying robot 6, or the like) via communication line 1b. The driving mechanism 34, the actuator 44, and the motor 47 are controlled by the control unit 1a. In addition, an operation of the operator via the operation panel 33 is recognized by the control unit 1a.

<Displacement Mode of Dock Plate>

FIGS. 3A to 3D are views showing the displacement mode of the dock plate 30, and are plan views of the load port 1. In this embodiment, the driving mechanism 34 can move the dock plate 30 in the X direction and rotate the dock plate 30 about an axis in the Z direction.

Figure 3:
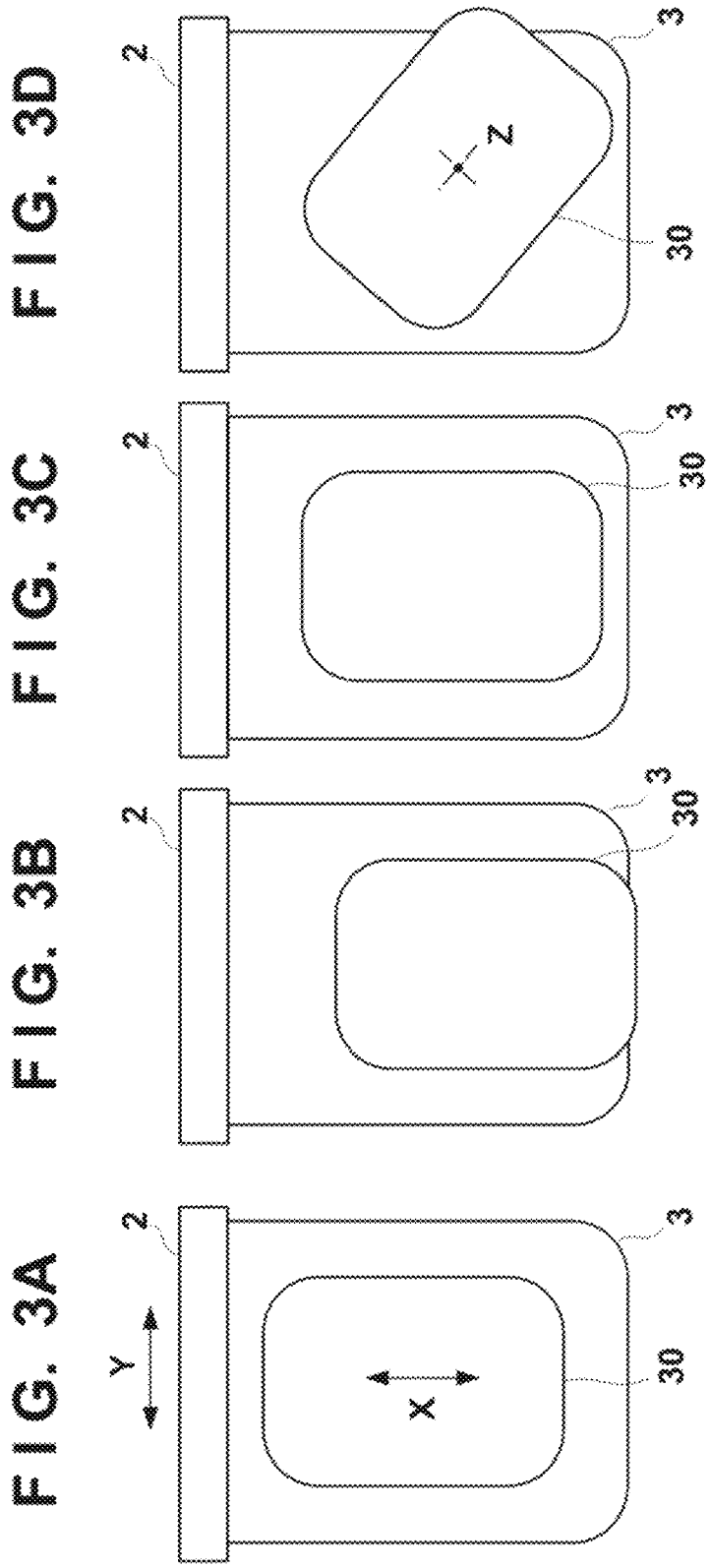
FIGS. 3A to 3D are views showing the displacement mode of the dock plate.

FIG. 3A shows a state in which the dock plate 30 is located at a position (to be also referred to as dock position hereinafter) closest to the PP side in the X direction with respect to the port plate 2. Opening/closing of the container 5 is performed at the dock position. FIG. 3B shows a state in which the dock plate 30 is located at a position (to be also referred to as a transfer position hereinafter) farthest from the port plate 2. When the operator manually places the container 5 on the dock plate 30 or manually unloads the placed container 5, the operation is performed at the transfer position. Even when the container 5 is automatically transferred using a container conveying robot between the port plate 2 and a container storage (stocker) in which a plurality of containers 5 are stocked, the operation is performed at the transfer position.

FIG. 3C shows a state in which the dock plate 30 is located at a position (to be also referred to as an intermediate position hereinafter) between the dock position and the transfer position. When the container 5 is automatically conveyed by an overhead hoist transport (OHT) system or the like installed in a semiconductor manufacturing factory, automatic placement of the container 5 on the dock plate 30 and automatic unloading of the placed container 5 are performed at the intermediate position.

FIG. 3D shows a state during rotation of the dock plate 30. In this embodiment, the dock plate 30 can rotate about the Z-axis at an arbitrary position in the X direction. Since the dock plate 30 can rotate, the operator places the container 5 on the dock plate 30 at, for example, the transfer position in a state in which the lid 51 is made to face the position side, and after that, the dock plate 30 is inverted by a rotation unit 83 and stopped. Accordingly, the lid 51 faces the side of the port plate 2. After that, the dock plate 30 is moved to the dock position shown in FIG. 3A.

<Structure of Driving Mechanism>

Figure 4:
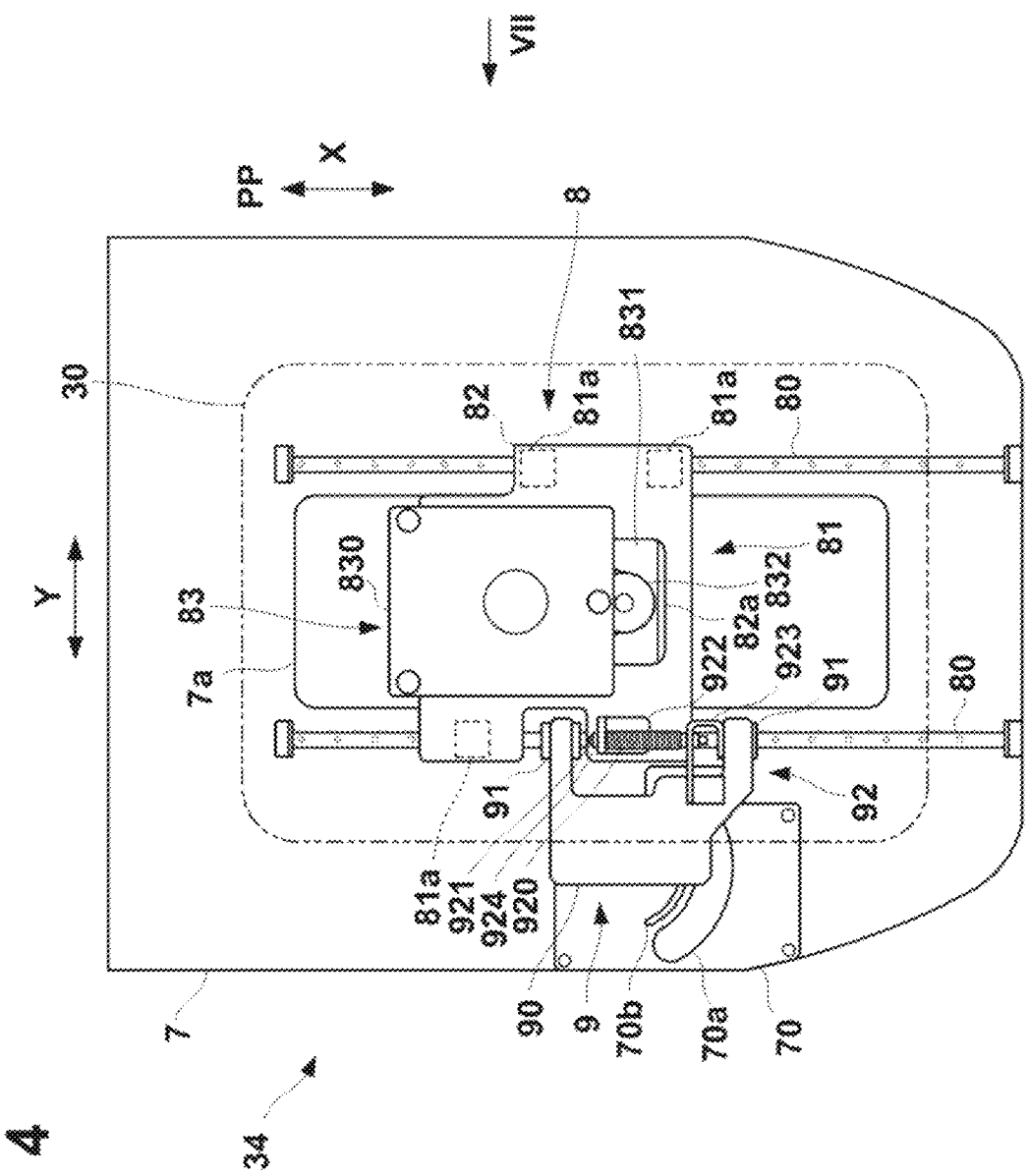
FIG. 4 is an explanatory view of the moving mechanism of the dock plate.
Figure 5:
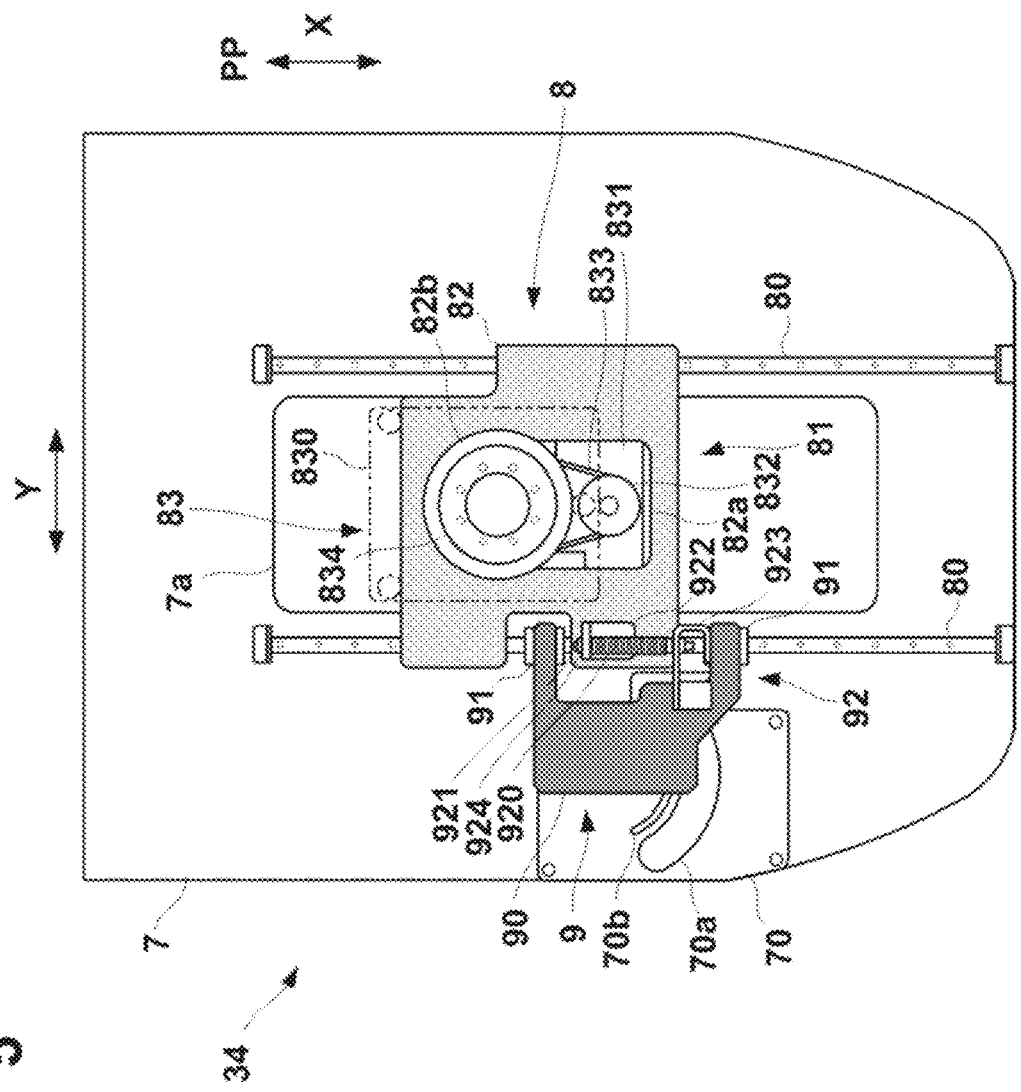
FIG. 5 is an explanatory view of the moving mechanism of the dock plate.
Figure 6:
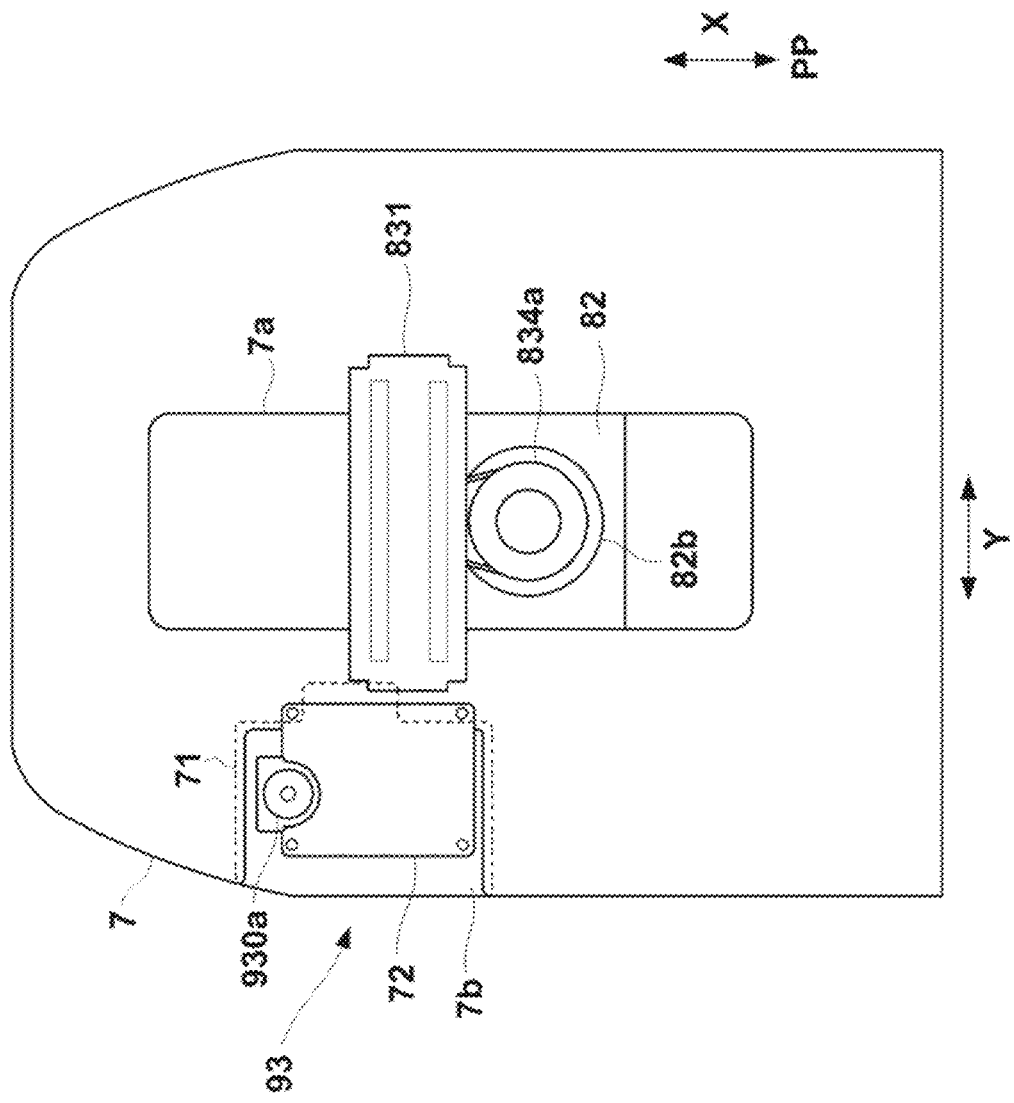
FIG. 6 is an explanatory view of the moving mechanism of the dock plate.

The structure of the driving mechanism 34 will be described. FIG. 4 is a plan view of the driving mechanism 34 seen through the dock plate 30. FIG. 5 is a plan view of the driving mechanism 34 seen through a support plate 830 in FIG. 4, and is a view showing a cam plate 90 and an intermediate plate 82 emphasized by patterns added to make them easy to view. FIG. 6 is a bottom view of the driving mechanism 34. FIG. 7 is a view taken in the direction of an arrow VII in FIG. 4, and is a right side view of the driving mechanism 34.

The driving mechanism 34 includes a base portion 7, a support unit 8, and a cam mechanism 9. The base portion 7 is a support body for the entire driving mechanism 34, and is a plate-shaped member in this embodiment. At the center of the base portion 7 in the Y direction, an opening portion 7a that is a rectangular through hole extending in the X direction is provided. In addition, a notch 7b is formed in the left side portion of the base portion 7, and some components of the cam mechanism 9 are disposed here.

The support unit 8 is arranged between the base portion 7 and the dock plate 30. The support unit 8 includes a pair of rail members 80, and a slider 81 that moves on the pair of rail members 80. The rail members 80 spaced apart in the Y direction are extended in the X direction and fixed to the base portion 7. The slider 81 on which the dock plate 30 is placed moves together with the dock plate 30. The moving range of the slider 81 corresponds to the range between the dock position and the transfer position, which is the moving range of the dock plate 30 in the X direction.

The slider 81 includes an intermediate plate 82 and the rotation unit 83. The intermediate plate 82 is fixed on a plurality of engaging members 81a that engage with the rail members 80 and slide along the rail members 80. At the center of the intermediate plate 82 in the Y direction, an opening portion 82a that is a through hole is formed.

The rotation unit 83 includes the support plate 830 that is a rotation target body. The dock plate 30 is placed on the support plate 830. The support plate 830 is fixed at the upper end portion of a rotation body 834, and rotates along with the rotation of the rotation body 834. The dock plate 30 thus rotates, as shown in FIG. 3D. The rotation body 834 is rotatably supported by a bearing 82b fixed to the intermediate plate 82, and extended through the intermediate plate 82 to its lower side. A pulley 834a is fixed at the lower end portion of the rotation body 834. The pulley 834a is located in the opening portion 7a of the base portion 7.

The rotation unit 83 includes an actuator 831 as its driving source. In this embodiment, the actuator 831 is a rotor cylinder, and a pulley 832 is fixed to the output shaft. An endless belt 833 is wound between the pulley 832 and the pulley 834a. When the actuator 831 is driven, the driving force is transmitted to the rotation body 834 to rotate the rotation body 834. In this embodiment, a rotor cylinder has been exemplified as the driving source of the rotation unit 83. However, it may be a motor. In addition, the driving transmission mechanism may be a mechanism other than a belt transmission mechanism.

The actuator 831 is suspended from the intermediate plate 82 via a bracket 835. The actuator 831 is located on the lower side of the base portion 7, and the bracket 835 is inserted into the opening portion 7a to connect the actuator 831 and the intermediate plate 82. The rotation unit 83 moves in the X direction together with the intermediate plate 82.

The cam mechanism 9 is a driving mechanism configured to move the intermediate plate 82 in the X direction. The cam mechanism 9 includes the cam plate 90 that is a moving target body. The cam plate 90 is fixed on a plurality of engaging members 91 slidably engaging along the rail member 80. The cam plate 90 is connected to the intermediate plate 82. When the cam plate 90 moves in the X direction, the intermediate plate 82 moves in the X direction.

Figure 8A:
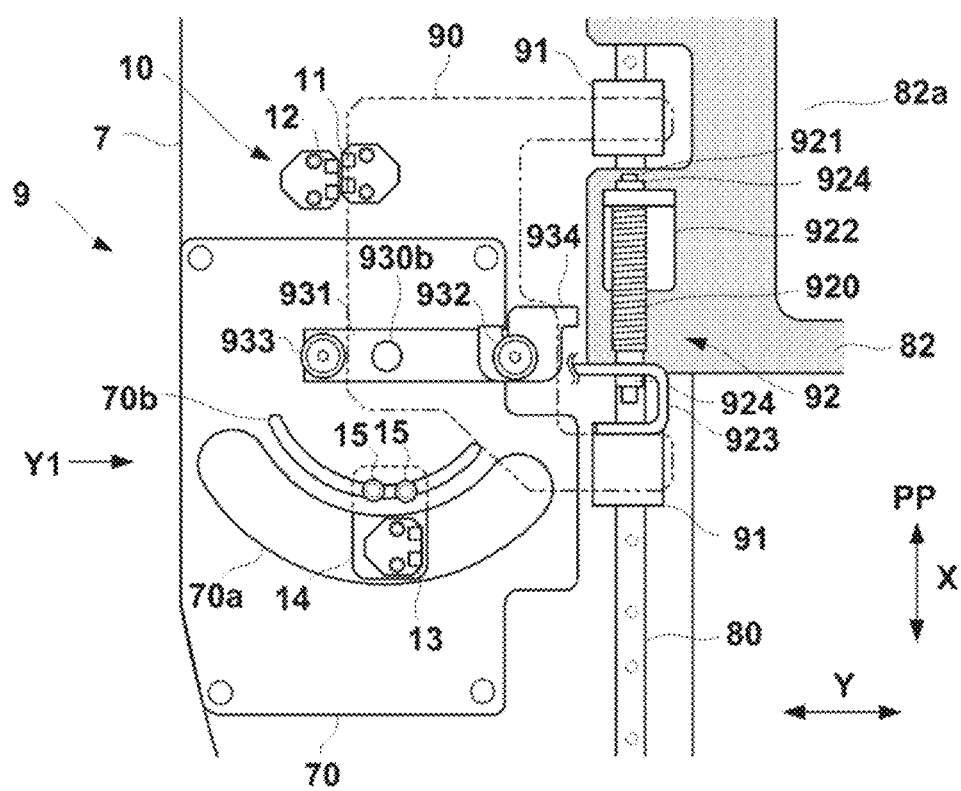
FIGS. 8A and 8B are explanatory views of the moving mechanism of the dock plate.

The cam plate 90 and the intermediate plate 82 are connected via a connecting mechanism 92. The cam plate 90 and the intermediate plate 82 may directly be connected. In this embodiment, however, the cam plate 90 and the intermediate plate 82 are connected with an intervention of an elastic member 920. The elastic member 920 buffers driving force transmission between them. That is, the cam plate 90 and the intermediate plate 82 can displace relative to each other in the X direction. Hence, for example, even if a foreign object is caught between the port plate 2 and the container 5 when moving the cam plate 90 to the dock position, the elastic member 920 elastically deforms so that only a load of a predetermined value or less that never injures the operator is applied. Additionally, at this time, the container 5, the cam plate 90, and the intermediate plate 82 cannot displace in a direction to move close to the port plate 2 anymore. As a result, operation safety can be ensured. The structure of the connecting mechanism 92 will be described with reference to FIG. 8A as well. FIG. 8A is an enlarged plan view of the periphery of the connecting mechanism 92.

The elastic member 920 may be rubber or the like, and is a coil spring in this embodiment. The connecting mechanism 92 includes a rod 921 inserted into the elastic member 920. The rod 921 is inserted into through holes provided in brackets 922 and 923. The bracket 922 is fixed to the intermediate plate 82, and the bracket 923 is fixed to the cam plate 90. A stopper 924 is provided at each end portion of the rod 921. The elastic member 920 generates a biasing force in a direction in which the brackets 922 and 923 separate, and the brackets 922 and 923 can move close to or apart from each other within the range of the two stoppers 924. That is, the cam plate 90 and the intermediate plate 82 can move close to or apart from each other within the range of the two stoppers 924. They are normally apart by the distance between the two stoppers 924 because of the biasing force of the elastic member 920, and can move close to each other only when some external load acts.

Figure 8B:
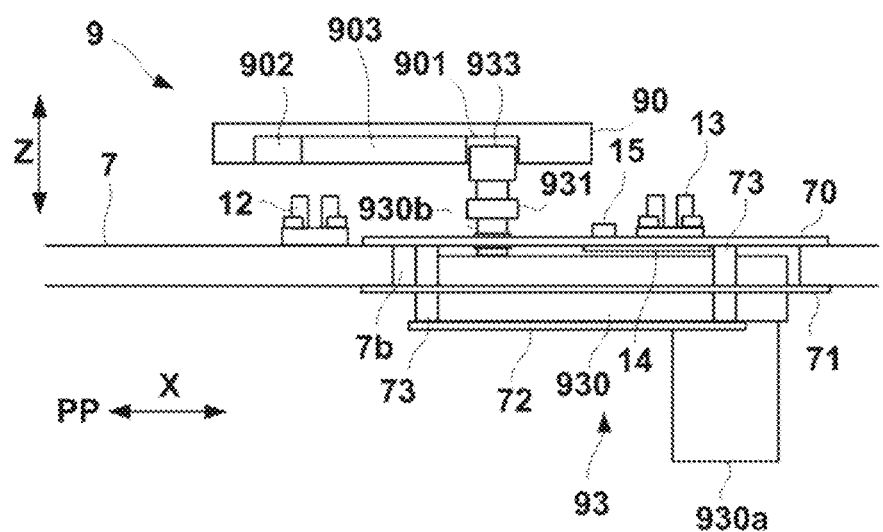
Figure 9A:
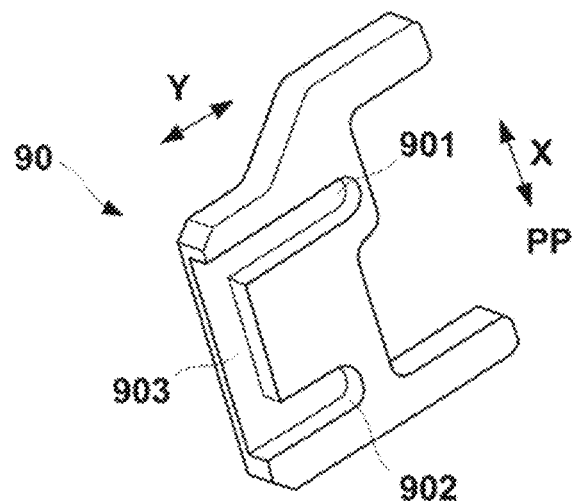
FIG. 9A is a perspective view of a cam plate.
Figure 9B:
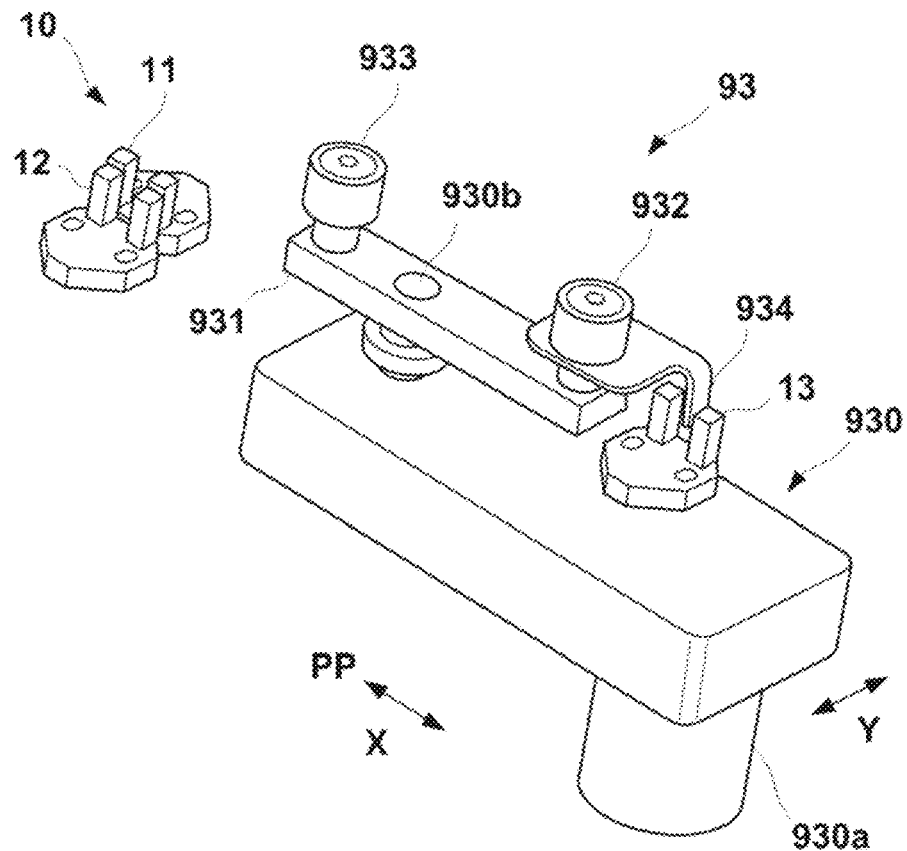
FIG. 9B is a perspective view of a driving mechanism and a detection unit.

The cam mechanism 9 will further be described with reference to FIGS. 4 to 9B. FIG. 8B is a partial side view of the driving mechanism 34 viewed in the direction of an arrow Y1 in FIG. 8A. FIG. 9A is a perspective view of the cam plate 90 viewed from the bottom surface side, and FIG. 9B is a perspective view of a driving mechanism 93 of the cam mechanism 9 and a detection unit 10.

The cam plate 90 includes cam grooves 901 and 902 formed in its bottom surface. The cam grooves 901 and 902 are formed apart in the X direction, and the cam groove 902 is located on the side of the port plate 2. Both the cam grooves 901 and 902 are linear grooves extended in the Y direction, and the cam groove 901 is longer. One-end sides (also called open end portions) of the cam grooves 901 and 902 are connected by a groove 903 extending in the X direction, and the other-end sides (also called closed end portions) are closed.

The driving mechanism 93 includes a rotation driving unit 930, a rotation shaft 930b, and a rotation member 931. The rotation driving unit 930 is a unit that drives a motor 930a and uses the rotation shaft 930b as the output shaft, and incorporates a transmission mechanism (a gear mechanism, a belt transmission mechanism, or the like) that transmits the output of the motor 930a to the rotation shaft 930b. The rotation driving unit 930 is arranged in the notch 7b of the base portion 7. The notch 7b is partially closed by an upper plate 70 and a lower plate 71. A support plate 72 that supports the rotation driving unit 930 is provided on the lower side of the lower plate 71. The support plate 72 is suspended from the upper plate 70 via columns 73. An opening configured to avoid interference with the columns 73 and the rotation driving unit 930 is formed in the lower plate 71.

The rotation shaft 930b is a shaft extending in the Z direction. The rotation member 931 is a long piece-shaped member fixed at the upper end portion of the rotation shaft 930*b* and extending in the horizontal direction. The rotation member 931 is pivotally supported by the rotation shaft 930*b* with an axis set to a position offset from the center position in the longitudinal direction to one side in the longitudinal direction. The rotation member 931 rotates about the rotation shaft 930*b* as the rotation center. Cam followers 932 and 933 engaging with the cam grooves 901 and 902 are rotatably provided at the end portions of the rotation member 931 in the longitudinal direction. The center axes of the cam followers 932 and 933 are directed in the Z direction.

The cam followers 932 and 933 are arranged at different positions in the circumferential direction of the rotation shaft 930*b*. In addition, the cam followers 932 and 933 and the rotation shaft 930*b* are located on the same line in the horizontal direction. The distances from the rotation shaft 930*b* to the cam followers 932 and 933 are different, and the distance from the rotation shaft 930*b* to the cam follower 932 is longer.

In this embodiment, the cam followers 932 and 933 have the same diameter, and the width of the cam grooves 901 and 902 in the X direction is slightly wider than the diameter of the cam followers 932 and 933. The separation distance between the center lines of the cam grooves 901 and 902 in the widthwise direction equals the separation distance between the axes of the cam followers 932 and 933.

The rotation member 931 is provided with a sensor dog 934. The detection unit 10 detects the sensor dog 934, thereby detecting the rotation posture of the rotation member 931. In this embodiment, the detection unit 10 is formed by three sensors 11 to 13. Each of the sensors 11 to 13 is a photo interrupter, and detects the existence of the sensor dog 934 between a light-receiving element and a light-emitting element. Note that to detect the rotation posture of the rotation member 931, any sensor other than the photo interrupter can be employed. For example, a rotary encoder configured to detect the rotation amount of the rotation member 931 may be used.

The sensors 11 and 12 are fixed to the base portion 7. The sensor 11 is a sensor configured to detect that the rotation member 931 is located at a position corresponding to the dock position of the dock plate 30. The rotation angle of the rotation member 931 at this position will be defined as an initial position (0°) for the descriptive convenience. The sensor 12 is a sensor configured to detect that the rotation member 931 is located at a position corresponding to the transfer position of the dock plate 30. The rotation angle of the rotation member 931 at this position is about 360° clockwise in a planar view.

The sensor 13 is provided such that its attachment position to the base portion 7 can be adjusted. More specifically, the sensor 13 is attached to the plate 70 via a bracket 14. Slits 70*a* and 70*b* each having an arc shape concentric with the rotation shaft 930*b* are formed in the plate 70. The bracket 14 is located on the lower side of the plate 70 and fixed to bolts 15 that are fixed to the plate 70 and provided while being inserted into the slit 70*b*. The attachment positions of the bolts 15 to the plate 70 can be adjusted along the slit 70*b*, and accordingly, the posture of the bracket 14 with respect to the plate 70 can be adjusted along the slit 70*b*. The sensor 13 is mounted on the bracket 14 and exposed to the upper side of the plate 70 via the slit 70*a*. Hence, when the bracket 14 is moved along the slit 70*b*, the sensor 13 is moved along the slit 70*a*.

The sensor 13 detects the position of the rotation member 931. More specifically, when the sensor 13 detects the rotation member 931, the dock plate 30 is located at the intermediate position. When the sensor 13 detects the rotation member 931, in this embodiment, the rotation member 931 has been rotated about 180° clockwise in a planar view (a state shown in FIG. 11B to be described later). The intermediate position of the dock plate 30 is a position used when the container 5 is automatically conveyed by an overhead hoist transport (OHT) system or the like. This position sometimes needs to be adjusted in accordance with the installation environment of the overhead hoist transport (OHT) system and the load port 1. In this embodiment, since the position of the sensor 13 is adjustable, it is possible to cope with a situation according to the installation environment.

Note that in this embodiment, the positions of the sensors 11 and 12 are fixed. However, the positions may be adjustable, like the sensor 13. The dock position and the transfer position need not often be adjusted. When the positions are fixed, the structure can be simplified.

<Operation of Cam Mechanism>

An example of the operation of the cam mechanism 9 will be described with reference to FIGS. 10A to 12C. These drawings are plan views showing the movement of the cam plate 90 when the rotation member 931 makes one revolution, and the cam plate 90 is shown in a transparent mode. Since the cam plate 90 is connected to the dock plate 30 via the support unit 8, the dock plate 30 moves along with the movement of the cam plate 90.

Figure 10A:
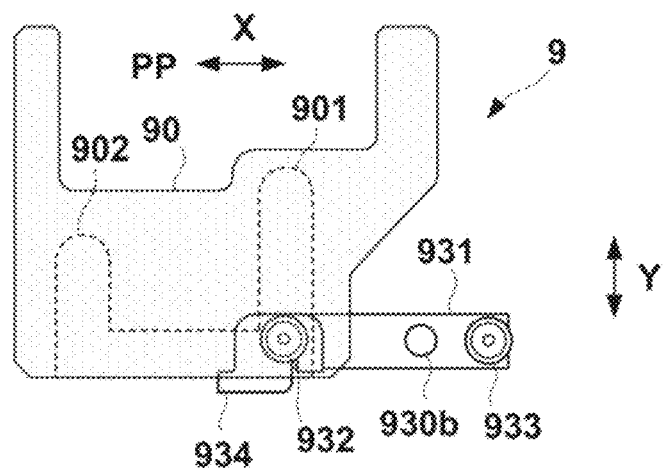
FIGS. 10A to 10C are explanatory views of the operation of a cam mechanism.

FIG. 10A shows a state in which the rotation angle of the rotation member 931 is 0°. At this time, the dock plate 30 is located at the dock position. The rotation shaft 930*b* and the cam followers 932 and 933 are located on the same line in the X direction. The sensor dog 934 is detected by the sensor 11, and the control unit 1*a* recognizes, based in the detection result, that the dock plate 30 is located at the dock position. The cam follower 932 is located at the open end portion (the lower end portion in FIG. 10A) of the cam groove 901.

Figure 10B:
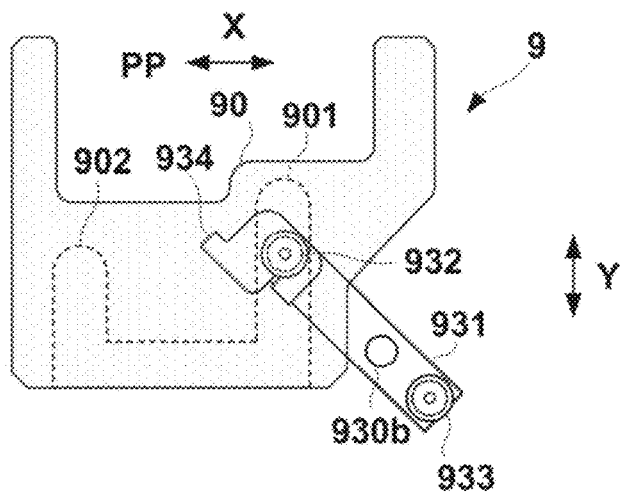

FIG. 10B shows a state in which the rotation member 931 has rotated clockwise by 45°. When the cam follower 932 engages with the cam groove 901 in the process of the rotation of the rotation member 931, the cam plate 90 moves in the X direction to a side to separate from the port plate 2 (a direction opposite to the PP side in the X direction; the rightward direction in FIG. 10B), and the dock plate 30 similarly moves in the X direction.

Figure 10C:
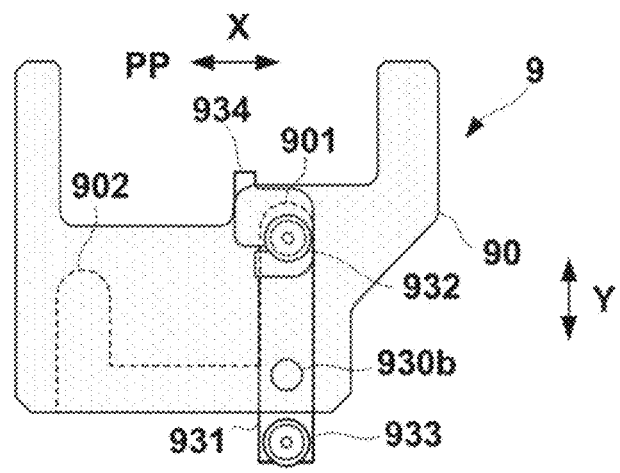

FIG. 10C shows a state in which the rotation member 931 has rotated clockwise by 90°. When the cam follower 932 engages with the cam groove 901 in the process of the rotation of the rotation member 931, the cam plate 90 further moves in the X direction to the side to separate from the port plate 2, and the dock plate 30 similarly further moves in the X direction. The cam follower 932 is located at the position (turn-around point) closest to the closed end portion (the upper end portion in FIG. 10C) of the cam groove 901, and the cam follower 932 never contacts the closed end portion. The rotation shaft 930*b* and the cam followers 932 and 933 are located on the same line in the Y direction.

Figure 11A:
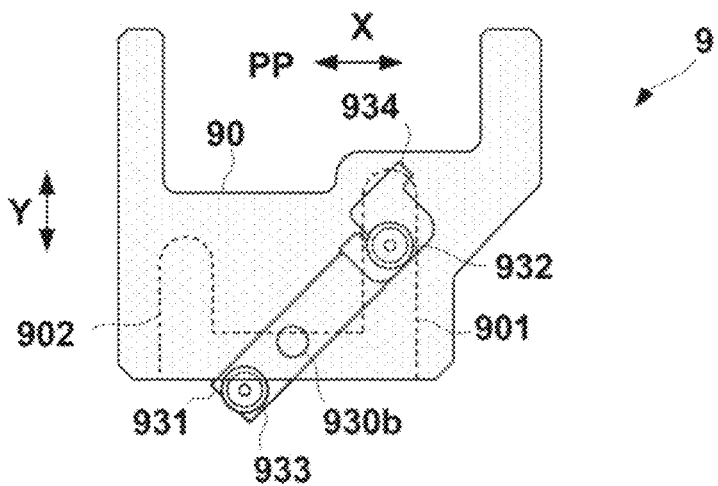
FIGS. 11A to 11C are explanatory views of the operation of the cam mechanism.

FIG. 11A shows a state in which the rotation member 931 has rotated clockwise by 135°. When the cam follower 932 engages with the cam groove 901 while moving to the side of the open end portion of the cam groove 901 in the process of the rotation of the rotation member 931, the cam plate 90 further moves in the X direction to the side to separate from the port plate 2, and the dock plate 30 also further moves in the same direction.

Figure 11B:
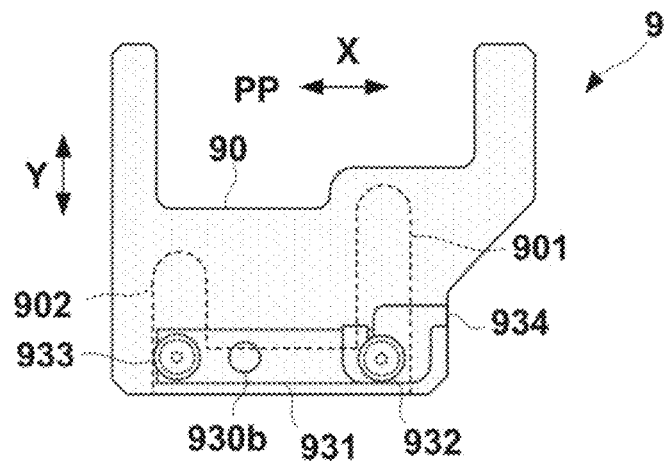

FIG. 11B shows a state in which the rotation member 931 has rotated clockwise by 180°. When the cam follower 932 engages with the cam groove 901 in the process of the rotation of the rotation member 931, the cam plate 90 further moves in the X direction to the side to separate from the port plate 2, and the dock plate 30 also further moves in the same direction and reaches the intermediate position. The cam follower 932 is located at the open end portion of the cam groove 901, and the cam follower 933 is located at the open end portion (the lower end portion in FIG. 11B) of the cam groove 902. The rotation shaft 930*b* and the cam followers 932 and 933 are located on the same line in the X direction. The positions of the cam followers 932 and 933 are reversed as compared to the state shown in FIG. 10A. The sensor dog 934 is detected by the sensor 13, and the control unit 1*a* recognizes, based in the detection result, that the dock plate 30 is located at the intermediate position.

Figure 11C:
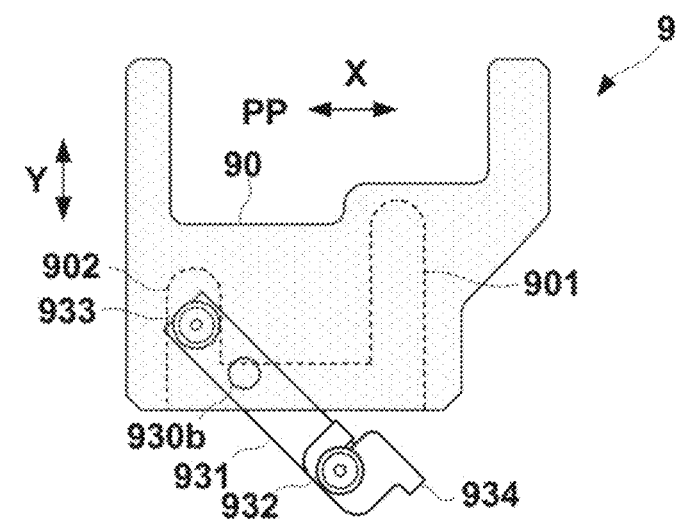

FIG. 11C shows a state in which the rotation member 931 has rotated clockwise by 225°. When the cam follower 933 engages with the cam groove 902 while moving to the side of the open end portion of the cam groove 902 in the process of the rotation of the rotation member 931, the cam plate 90 further moves in the X direction to the side to separate from the port plate 2, and the dock plate 30 also further moves in the same direction.

Figure 12A:
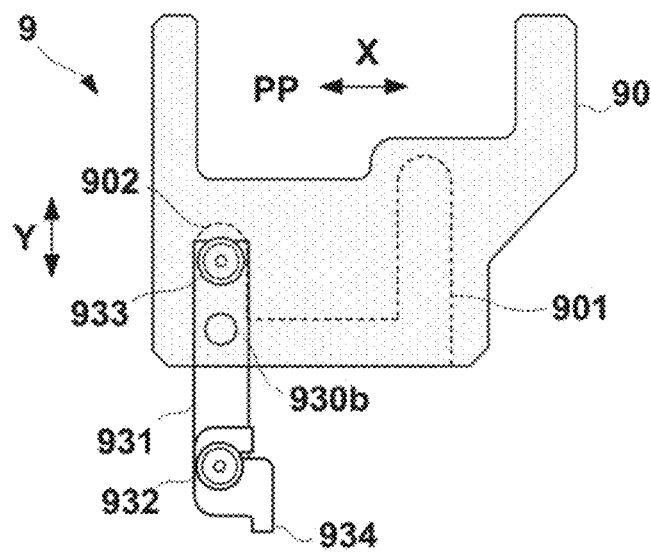
FIGS. 12A to 12C are explanatory views of the operation of the cam mechanism.

FIG. 12A shows a state in which the rotation member 931 has rotated clockwise by 270°. When the cam follower 933 engages with the cam groove 902 in the process of the rotation of the rotation member 931, the cam plate 90 further moves in the X direction to the side to separate from the port plate 2, and the dock plate 30 also further moves in the same direction. The cam follower 933 is located at the position (turn-around point) closest to the closed end portion of the cam groove 902. The rotation shaft 930*b* and the cam followers 932 and 933 are located on the same line in the Y direction. The positions of the cam followers 932 and 933 are reversed as compared to the state shown in FIG. 10C.

Figure 12B:
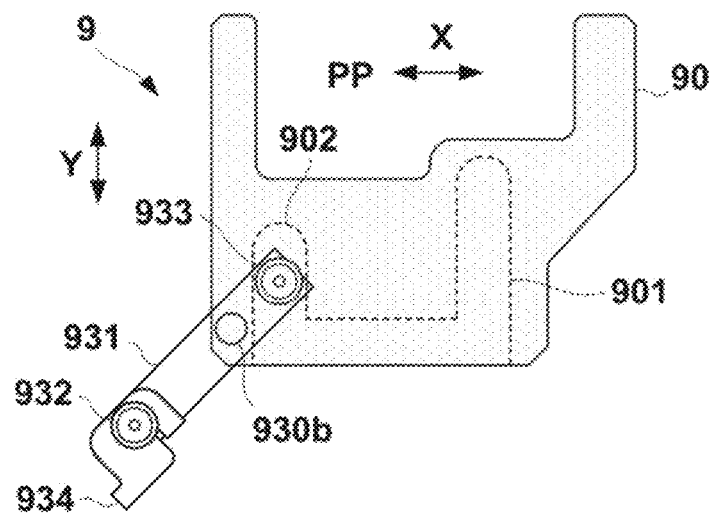

FIG. 12B shows a state in which the rotation member 931 has rotated clockwise by 315°. When the cam follower 933 engages with the cam groove 902 while moving to the side of the open end portion of the cam groove 902 in the process of the rotation of the rotation member 931, the cam plate 90 further moves in the X direction to the side to separate from the port plate 2, and the dock plate 30 also further moves in the same direction.

Figure 12C:
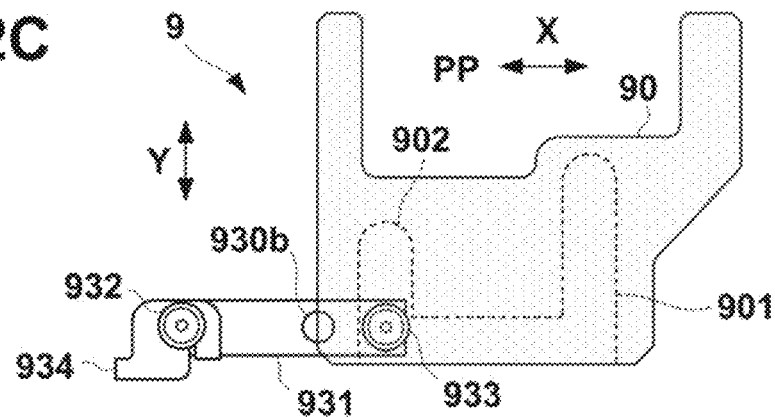

FIG. 12C shows a state in which the rotation member 931 has rotated clockwise by about 360°. When the cam follower 933 engages with the cam groove 902 in the process of the rotation of the rotation member 931, the cam plate 90 further moves in the X direction to the side to separate from the port plate 2, and the dock plate 30 also further moves in the same direction and reaches the transfer position. The cam follower 933 is located at the open end portion of the cam groove 902. The rotation shaft 930*b* and the cam followers 932 and 933 are located almost on the same line in the X direction. The state is not the same as the state shown in FIG. 10A. In fact, the rotation stops at a position slightly before 360° because of the difference between the attachment positions of the sensors 11 and 12. The sensor dog 934 is detected by the sensor 12, and the control unit 1*a* recognizes, based in the detection result, that the dock plate 30 is located at the transfer position.

In this embodiment, the sensor 11 and the sensor 12 are separately provided. However, only the sensor 11 may be installed, and both the dock position and the transfer position may be detected by the sensor 11. In this case, the state shown in FIG. 10A and the state shown in FIG. 12C are the same state.

To move the dock plate 30 from the transfer position to the intermediate position and from the intermediate position to the dock position, the rotation member 931 is rotated counterclockwise.

As described above, in this embodiment, the dock plate 30 can be moved between the dock position and the transfer position by one revolution of the rotation member 931. In addition, when the rotation member 931 is rotated halfway, the dock plate 30 can be moved between the dock position and the intermediate position or between the intermediate position and the transfer position. Since the rotation of the rotation member 931 and the combination of the two sets of cam grooves and cam followers are used, the actuator serving as the driving source need not be extended throughout the moving stroke of the dock plate 30, and the load port 1 capable of moving the dock plate 30 by a relatively compact mechanism can be provided. The intermediate position can be set to an arbitrary position by adjusting the rotation amount of the rotation member 931 and the position of the sensor 13. In addition, the dock plate 30 can also be rotated. Hence, the load port 1 according to this embodiment can be installed and used without depending on the installation environment or operation state of a container storage (stocker), an overhead hoist transport (OHT) system, or the like.

In addition, when the operator can select a plurality of control modes corresponding to the types of stop positions of the dock plate 30, more flexile use is possible. The plurality of control modes can include a first control mode in which the transfer position is not used as the stop position of the dock plate 30. In the first control mode, two positions, that is, the dock position and the intermediate position are used as the stop position of the dock plate 30. The control modes can also include a second control mode in which the intermediate position is not used as the stop position of the dock plate 30. In the second control mode, two positions, that is, the dock position and the transfer position are used as the stop position of the dock plate 30. In addition, the control modes can also include a third control mode in which all the three positions, that is, the dock position, the intermediate position, and the transfer position are used as the stop position of the dock plate 30. The first to third control modes can further include control modes in which whether to rotate the dock plate 30 is different.

More specifically, in the first control mode in which only the two positions, that is, the dock position and the intermediate position are used as the stop position of the dock plate 30, only a control mode in which the dock plate 30 is not rotated is included, and a control mode in a case in which the dock plate 30 is rotated is not included.

In the second control mode in which the intermediate position is not used as the stop position of the dock plate 30, a control mode in a case in which the dock plate 30 is rotated at an arbitrary position other than a region where the container 5 and the port plate 2 interfere at the time of rotation of the dock plate 30 on which the container 5 is placed and a control mode in a case in which the dock plate 30 is not rotated are included. In other words, the arbitrary position is an arbitrary point in a region where the container 5 and the port plate 2 do not interfere at the time of rotation of the dock plate 30, and may include the transfer position.

In the third control mode in which all the three positions, that is, the dock position, the intermediate position, and the transfer position are used as the stop position of the dock plate 30, a control mode in a case in which the dock plate 30 is rotated at an arbitrary position closer to the transfer position than the intermediate position because if the dock plate on which the container 5 is placed is rotated, the container 5 and the port plate 2 interfere, and a control mode in a case in which the dock plate 30 is not rotated are included. The arbitrary position may be the transfer position.

Figure 13A:
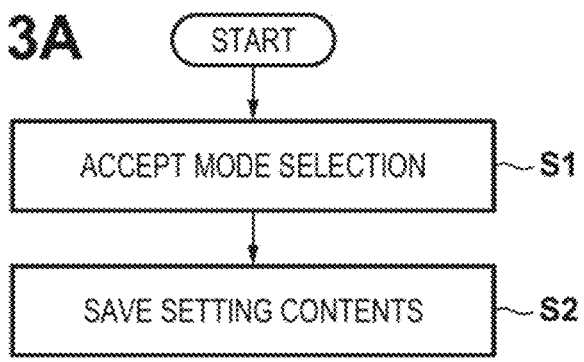
FIGS. 13A and 13B are flowcharts showing an example of processing of a control unit.

FIG. 13A is a flowchart showing an example of processing of accepting selection of a control mode, and shows an example of processing to be executed by the control unit 1a. In step S1, selection of a control mode by the operator from a plurality of predetermined control modes is accepted. The selection of the control mode is accepted by input via the operation panel 33 or input from a host computer or the like capable of communicating with the control unit 1a via the communication line 1b. In step S2, the selection contents in step S1 are saved to set the control mode. From then on, the control unit 1a operates the load port 1 in the set control mode.

Figure 13B:
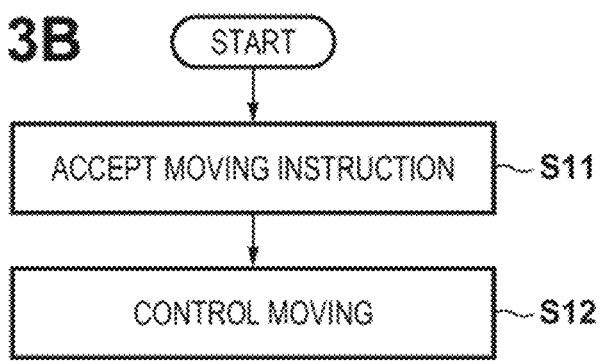

FIG. 13B is a flowchart showing an example of processing in a case in which the operation of the load port 1 is controlled by the control unit 1a after the control mode is set, and particularly shows an example of moving control of the dock plate 30. In step S11, a moving instruction of the dock plate 30 is accepted. The moving instruction is accepted by operator's manual input via the operation panel 33 or control instruction input from a host computer or the like capable of communicating with the control unit 1a via the communication line 1b during automatic control of the system.

In step S12, the moving instruction accepted in step S11 is executed in accordance with the set control mode. For example, if the first control mode in which the transfer position is not used as the stop position of the dock plate 30 is set, the rotation member 931 is rotated halfway while switching the rotation direction every time a moving instruction is accepted. Accordingly, every time a moving instruction is accepted, the dock plate 30 moves from the dock position to the intermediate position and from the intermediate position to the dock position. The rotation range of the rotation member 931 is a half rotation.

Additionally, for example, if the second control mode in which the intermediate position is not used as the stop position of the dock plate 30 is set, the rotation member 931 is rotated by one revolution while switching the rotation direction every time a moving instruction is accepted. Accordingly, every time a moving instruction is accepted, the dock plate 30 moves from the dock position to the transfer position and from the transfer position to the dock position. The rotation range of the rotation member 931 is one revolution.

Also, for example, if the third control mode in which all the three positions, that is, the dock position, the intermediate position, and the transfer position are used as the stop position of the dock plate 30 is set, the rotation member 931 is rotated halfway every time a moving instruction is accepted. The rotation direction is switched for every two moving instructions. Accordingly, every time a moving instruction is accepted, the dock plate 30 moves from the dock position to the intermediate position, from the intermediate position to the transfer position, from the transfer position to the intermediate position, and from the intermediate position to the dock position. The rotation range of the rotation member 931 is one revolution.

Second Embodiment

Figure 14:
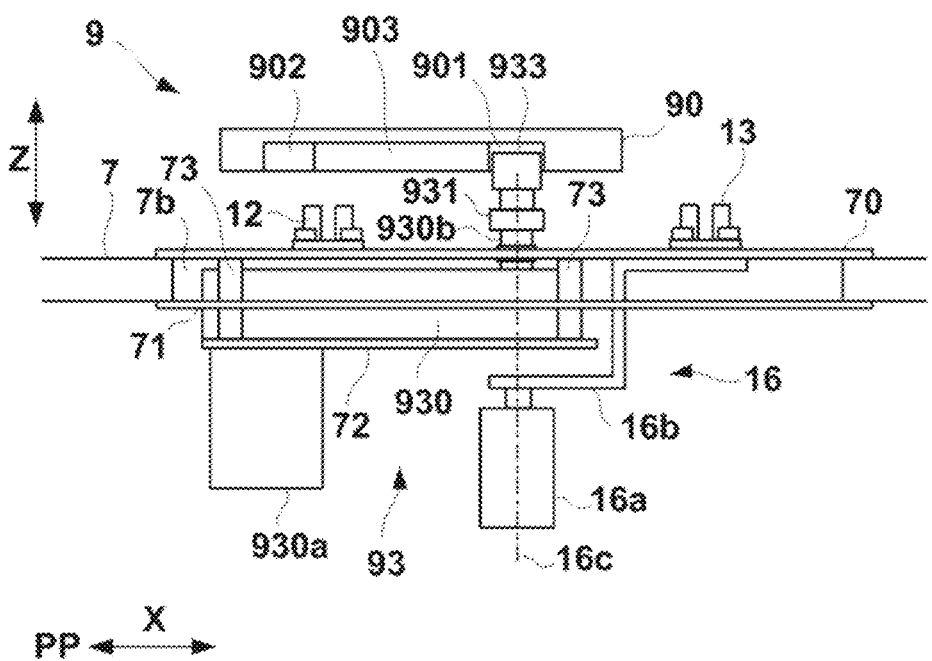
FIG. 14 is a view showing an example of the moving mechanism of a sensor.

In place of the attachment structure of a sensor 13 using a bracket 14, a sensor moving mechanism configured to automatically change the position of the sensor 13 may be provided. FIG. 14 is a partial side view of a driving mechanism 34, which shows an example of the sensor moving mechanism, and is a view (corresponding to FIG. 8B) viewed in the direction of an arrow Y1 in FIG. 8A.

A sensor moving mechanism 16 includes a motor 16a serving as a driving source, and an arm member 16b that is fixed to the output shaft of the motor 16a and pivots. The sensor 13 is mounted on the arm member 16b. The motor 16a is supported by a base portion 7 via a bracket (not shown). To ensure the space to arrange the sensor moving mechanism 16, the arrangement of a rotation driving unit 930 and the like is different from the first embodiment.

A center line 16c of the output shaft of the motor 16a is located on the same axis as a rotation shaft 930b, and the arm member 16b pivots about the center line 16c. By the pivotal movement of the arm member 16b, the sensor 13 can be moved in the circumferential direction of the rotation shaft 930b in a slit 70a to change the detection position. A driving unit 1a controls the rotation of the motor 16a in accordance with the operation of an operator for an operation panel 33. As for position adjustment of the sensor 13 using the bracket 14, the position adjustment of the sensor 13 can automatically be performed.

The invention is not limited to the foregoing embodiments, and various variations/changes are possible within the spirit of the invention.

What is claimed is:

1. A load port comprising:
 a port plate including an opening portion capable of taking in and out a substrate; and
 a placing table on which a container that stores the substrate is placed,
 wherein the placing table comprises:
 a base portion;
 a dock plate on which the container is placed;
 a support unit provided between the base portion and the dock plate and configured to support the dock plate such that the dock plate can move between a first position on a side of the port plate and a second position apart from the port plate; and
 a cam mechanism configured to move the dock plate between the first position and the second position with respect to the base portion,
 the support unit includes a slider on which the dock plate is placed and which is configured to move together with the dock plate,
 the cam mechanism includes:
 a driving mechanism provided on the base portion; and
 a cam plate which is connected to the slider and in which a cam groove is formed,
 the driving mechanism includes:
 a rotation driving unit;
 a rotation shaft rotated by the rotation driving unit;
 a long piece-shaped rotation member fixed to the rotation shaft and configured to rotate about the rotation shaft as a rotation center; and
 a first cam follower and a second cam follower, which are provided in the rotation member, and
 the cam groove includes:
 a first cam groove engaging with the first cam follower; and
 a second cam groove formed at a position different from the first cam groove in a moving direction of the dock plate and engaging with the second cam follower.

2. The load port according to claim 1, wherein the slider comprises:
 an intermediate plate connected to the cam plate and moved by the cam mechanism; and a rotation unit provided on the intermediate plate and configured to rotatably support the dock plate.

3. The load port according to claim 2, wherein an elastic member intervenes between the cam plate and the intermediate plate.

4. The load port according to claim 1, further comprising a detection unit provided on the base portion and configured to detect a rotation posture of the rotation member.

5. The load port according to claim 4, wherein the detection unit detects the rotation posture of the rotation member when the dock plate is located at the first position, the second position, or an intermediate position between the first position and the second position.

6. The load port according to claim 5, wherein the detection unit includes first to third sensors provided in correspondence with the first position, the second position, and the intermediate position, and
a position of the third sensor provided in correspondence with the intermediate position can freely be adjusted with respect to the base portion.

7. The load port according to claim 6, further comprising a sensor moving mechanism including a driving source and configured to change the position of the third sensor provided in correspondence with the intermediate position in a circumferential direction of the rotation shaft by a driving force of the driving source.

8. The load port according to claim 1, wherein the first cam follower and the second cam follower are arranged at different positions in a circumferential direction of the rotation shaft and have distances different from each other up to the rotation shaft.

9. The load port according to claim 1, wherein
the first cam groove and the second cam groove are linear grooves extending in a direction orthogonal to the moving direction of the dock plate,
the rotation shaft, the first cam follower, and the second cam follower are located on the same line, and
when the same line is parallel to the moving direction of the dock plate, the dock plate is located at one of the first position and the second position.

10. The load port according to claim 1, wherein
during a time when the rotation member rotates halfway from an initial position, the dock plate is moved to an intermediate position between the first position and the second position by engagement between the first cam follower and the first cam groove,
during a time when the rotation member rotates by one revolution from a position of the rotation member that has rotated halfway, the dock plate is moved from the intermediate position to the second position by engagement between the second cam follower and the second cam groove, and
a first control mode in which a rotation range of the rotation member is a half rotation from the initial position and a second control mode in which the rotation range of the rotation member is one revolution from the initial position can be selected.

11. The load port according to claim 10, wherein a third control mode in which the rotation range of the rotation member is one revolution from the initial position can be selected, and in the third control mode, rotation of the rotation member is stopped every time the rotation member rotates halfway.

12. A control method of a load port of claim 1, wherein
during a time when the rotation member rotates halfway from an initial position, the dock plate is moved to an intermediate position between the first position and the second position by engagement between the first cam follower and the first cam groove,
during a time when the rotation member rotates by one revolution from a position of the rotation member that has rotated halfway, the dock plate is moved from the intermediate position to the second position by engagement between the second cam follower and the second cam groove,
the control method comprises:
accepting selection of one of a first control mode and a second control mode: and
rotating the rotation member to move the dock plate, and
in the rotating, if the first control mode is set, the rotation member is rotated within a rotation range corresponding to a half rotation from the initial position, and if the second control mode is set, the rotation member is rotated within a rotation range corresponding to one revolution from the initial position.

13. The control method according to claim 12, wherein
in the accepting, selection of a third control mode can be accepted, and
in the rotating, if the third control mode is set, the rotation member is rotated within a rotation range corresponding to one revolution from the initial position, and rotation of the rotation member is stopped every time the rotation member rotates halfway.

* * * * *